(12) United States Patent
Matsuda

(10) Patent No.: US 10,283,472 B2
(45) Date of Patent: May 7, 2019

(54) ELECTRODE FOR A SEMICONDUCTOR DEVICE OF A BALL GRID ARRAY (BGA) TYPE

(71) Applicant: SUMITOMO ELECTRIC DEVICE INNOVATIONS, INC., Yokohama, Kanagawa (JP)

(72) Inventor: Keita Matsuda, Kanagawa (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 0 days.

(21) Appl. No.: 15/626,916

(22) Filed: Jun. 19, 2017

(65) Prior Publication Data
US 2017/0365571 A1  Dec. 21, 2017

(30) Foreign Application Priority Data
Jun. 20, 2016 (JP) ................. 2016-121955

(51) Int. Cl.
*H01L 23/00* (2006.01)
*H01L 23/498* (2006.01)
*H01L 21/48* (2006.01)

(52) U.S. Cl.
CPC ............ *H01L 24/13* (2013.01); *H01L 21/486* (2013.01); *H01L 23/49816* (2013.01); *H01L 23/49827* (2013.01); *H01L 23/49866* (2013.01); *H01L 24/11* (2013.01); *H01L 24/14* (2013.01); *H01L 2224/11462* (2013.01); *H01L 2224/13009* (2013.01); *H01L 2224/13123* (2013.01); *H01L 2224/13124* (2013.01); *H01L 2224/13147* (2013.01); *H01L 2224/13166* (2013.01); *H01L 2224/13171* (2013.01); *H01L 2224/1401* (2013.01); *H01L 2224/1405* (2013.01); *H01L 2224/145* (2013.01); *H01L 2224/1412* (2013.01); *H01L 2224/14104* (2013.01)

(58) Field of Classification Search
CPC . H01L 24/13; H01L 23/49866; H01L 21/486; H01L 23/49816; H01L 23/49827; H01L 24/11; H01L 24/14; H01L 2224/14104; H01L 2224/1412; H01L 2224/11462; H01L 2224/1405; H01L 2224/1401; H01L 2224/13
See application file for complete search history.

(56) References Cited

U.S. PATENT DOCUMENTS

2004/0041270 A1* 3/2004 Shimizu ............ H01L 23/49822
257/758
2011/0100695 A1* 5/2011 Lin ................... H01L 23/49811
174/261

FOREIGN PATENT DOCUMENTS

JP          06-120803          11/2006

* cited by examiner

*Primary Examiner* — Selim U Ahmed
(74) *Attorney, Agent, or Firm* — Smith, Gambrell & Russell, LLP

(57) ABSTRACT

A semiconductor device of the ball grid array (BGA) type, the device having an electrode, and a process of forming the electrode are disclosed. The electrode includes an insulating film, a seed layer on the insulating film, a mound metal on the insulating film and an interconnection on the seed layer. The mound metal surrounds the seed layer without forming any gap therebetween. The interconnection, which is formed by electroless plating, is apart from the insulating film with the mound metal as an extension barrier for the plating.

20 Claims, 6 Drawing Sheets

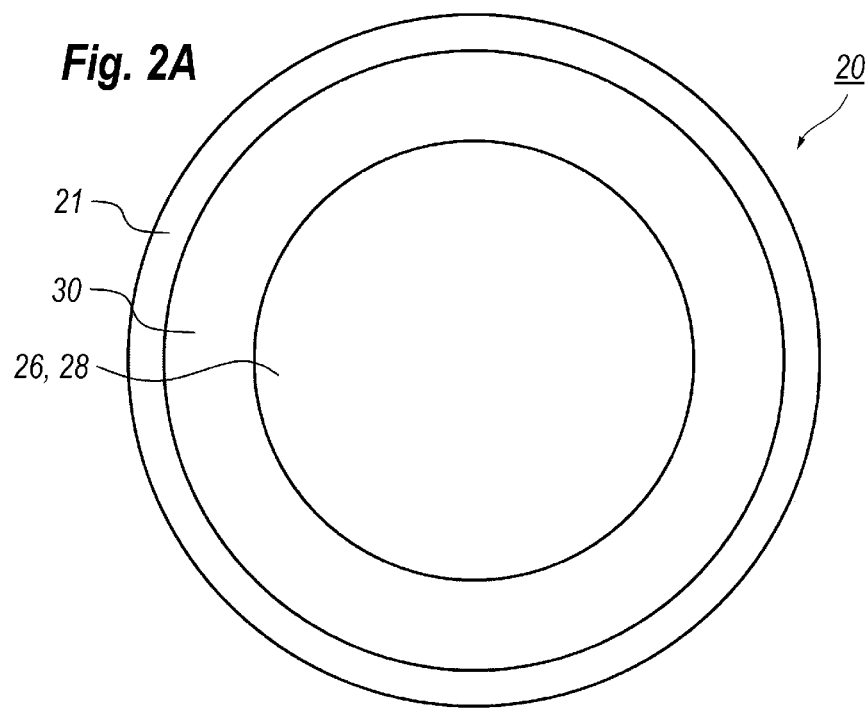
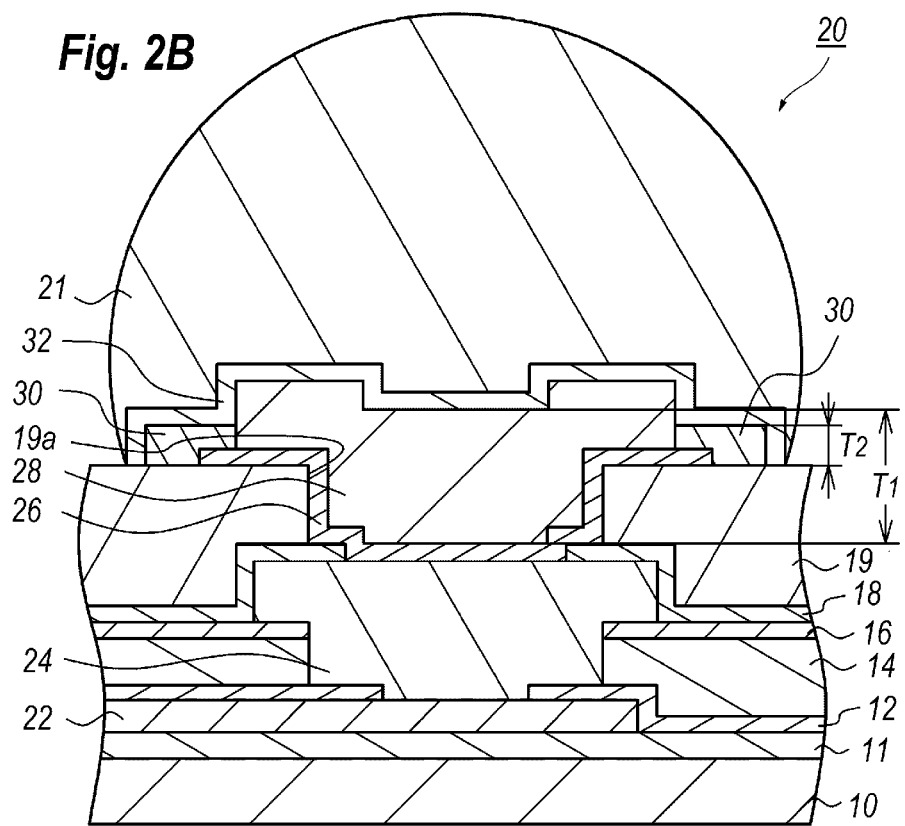

ELECTRODE FOR A SEMICONDUCTOR DEVICE OF A BALL GRID ARRAY (BGA) TYPE

CROSS REFERENCE TO RELATED APPLICATIONS

The present application claims the benefit of priority of Japanese Patent Application No. 2016-121955, filed on Jun. 20, 2016, which is incorporated herein by reference.

BACKGROUND OF THE INVENTION

Field of the Invention

The present application relates to a semiconductor device, in particular, a semiconductor device having pads that suppress invasion of water within a semiconductor active element, and a process of forming the same.

Related Prior Arts

A package with a type of the ball grid array (BGA) has been well known in a field of the semiconductor device. The BGA generally provides a solder bump, or sometimes called as a solder bump, soldered to a circuit board mounting the semiconductor device. A Japanese Patent Application laid open No. 2006-120803A has disclosed a semiconductor device that provides a solder bump formed on an electrode containing metal layers, one of which is operable as a reinforcing layer. A semiconductor device generally provides a passivation film made of electrically insulating material such as polyimide and so on where the passivation film may cover a whole of active elements and interconnections except for pads. An electrode with a solder bump that is formed on the pads sometimes provides an under bump metal (UBM) on an interconnection, in order to effectively protect the interconnection from moisture, or solder itself. However, a metal layer operable as the UBM generally has lesser adhesion against the passivation film. Accordingly, the metal layer is likely peeled off from the passivation film. Thermal stress induced during heat treatments of the semiconductor device may possibly form a gap between the metal layer and the passivation film and the gap provides a path for water, or solder to invade into the semiconductor device.

SUMMARY OF THE INVENTION

One aspect of the present invention relates to a semiconductor device that provides an electrode type of ball grid array (BGA). The electrode in the semiconductor device provides an insulating film, a seed layer, a mound metal, and an interconnection. The seed layer is provided on the insulating film. The mound metal provided on the insulating film and surrounds the seed layer, where the mound metal forms no gap against the seed layer. The interconnection is provided on the seed layer. A feature of the electrode of the present invention is that the interconnection is apart from the insulating film as interposing the seed layer and the mound metal therebetween.

Another aspect of the present invention relates to a process of forming the semiconductor device, in particular, a process of forming an electrode type of the ball grid array. The process includes steps of: (1) forming an insulating film; (2) forming a seed layer on the insulating film; (3) forming a mound metal so as to surround the seed layer on the insulating film, where the mound metal has an outer edge and an inner edge, and forms no gap against the seed layer; and (4) forming an interconnection on the seed layer by electroless plating, where the interconnection is apart from the insulating film as interposing the seed layer and the mound metal therebetween. A feature of the process of the invention is that the mound metal becomes an effective barrier for the interconnection extending laterally during the electroless plating.

BRIEF DESCRIPTION OF THE DRAWINGS

The foregoing and other purposes, aspects and advantages will be better understood from the following detailed description of a preferred embodiment of the invention with reference to the drawings, in which:

FIG. 2A magnifies one electrode and FIG. 2B shows a cross section of the electrode taken along the line IIB-IIB indicated in FIG. 1;

DESCRIPTION OF EMBODIMENT

Embodiment according to the present invention will be described as referring to accompanying drawings. In the description of the drawings, numerals or symbols same with or similar to each other will refer to elements same with or similar to each other without duplicated explanations.

First Embodiment

Figure 1:
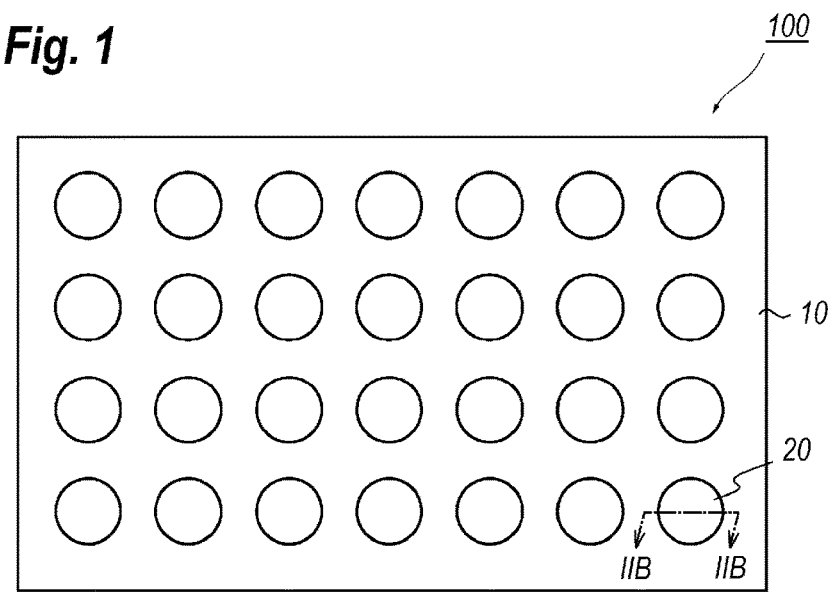
FIG. 1 is a plan view showing a semiconductor device with a type of ball grid array (BGA) according to embodiment of the present invention.

FIG. 1 is a plan view showing a semiconductor device 100 according to the first embodiment of the present invention. The semiconductor device 100 is a type of a ball grid array (BGA) device that includes electrodes 20 arranged in an array on a surface of a substrate 10 thereof. FIG. 2A is a plan view magnifying one electrode 20 as showing structures beneath a solder bump 21 by seeing therethrough; and FIG. 2B shows a cross section of the electrode 20 taken along the line IIB-IIB indicated in FIG. 1. The electrode 20, which has a circular plane shape, provides a mound metal 30 that surrounds metal layers, 26 and 28, and the solder bump 21 covers an outer side of the mound metal 30. The semiconductor device 100 provides, on a substrate 10 made of silicon carbide (SiC) or sapphire (Al$_2$O$_3$) and having electrically insulating characteristic, a semiconductor stack 11 that includes a channel layer made of gallium nitride (GaN), a barrier layer made of aluminum gallium nitride (AlGaN), and so on, to constitute a field effect transistor (FET). Signals with high frequency components are input to and output from the electrode 20.

The semiconductor device 100 further provides, on the semiconductor stack 11, a metal layer 22 that is in direct contact with the semiconductor stack 11, an insulating film 12 that covers the semiconductor stack 11 and the metal layer 22, and another metal layer 24, where the insulating layer 12 provides an opening that exposes a top of the metal layer 22. The metal layer 22 includes titanium (Ti), which may be ohmic electrode for the drain and the source. The other metal layer 24, which operates as a first interconnection connected to the ohmic electrode 22, may be made of gold (Au) and/or aluminum (Al). The metal layers, 22 and 24, may have a total thickness of 1 to 5 μm. The former metal layer 22 will be called as the ohmic electrode, while, the latter metal layer 24 will be hereinafter called as the first interconnection.

The semiconductor device 100 still further provides other insulating films, 14, 16, and 18, on the insulating film 12, where the insulating film 12 is called the first insulating film 12, and those insulating films, 14 to 18, may be called as the second, the third and the fourth insulating films, respectively. The fourth insulating film 18 covers the top of the third insulating film 16 and a part of a top and sides of the first interconnection 24. The semiconductor device 100 may still further provide an insulating film 19, which may be called as a top insulating film. The fourth and top insulating films, 18 and 19, provide an opening 19a within which the top of the first interconnection 24 exposes. The first, third and fourth insulating films, 12, 16 and 18, may be made of silicon nitride (SiN) with a thickness of 0.1 to 0.5 μm; the second and top insulating films, 14 and 19, may be made of polyimide with a thickness less than 10 μm.

Another metal layer 26, which may be called as seed layer, covers the top of the first interconnection 24 exposed within the opening 19a, a side of the top insulating film 19 also exposed within the opening 19a, and a part of a top surface of the top insulating film 19 in a periphery of the opening 19a. The seed layer 26 may operate as a seed metal during the plating process. The opening 19a of the top insulating film 19 is filled with a metal layer 28, which may be called as the second interconnection. The second interconnection 28 overlaps with the seed layer 26 but exposes the periphery of the seed layer 26 in a periphery thereof.

Specifically, portions close to the edges of the seed layer 26 on the top insulating film 19 are not covered with the second interconnection 28 but covered with a mound metal 30 as shown in FIG. 2B. The second interconnection 28 in an outer edge thereof is in contact with an inner edge of the mound metal 30 but apart from the top insulating film 19 as interposing the seed layer 26 and the mound metal 30. The semiconductor device 100 may further provide a cover metal 32 that covers the top of the second interconnection 28, the top of the mound metal 30, and tip ends thereof is in contact with the top insulating film 19 at points immediate to the outer edge of the mound metal 30. Finally, a solder bump 21 is formed so as to cover the cover metal 32.

The seed layer 26 may be made of palladium (Pd), copper (Cu), zinc (Zn) and so on. The present embodiment provides the seed layer 26 made of palladium (Pd). The second interconnection 28 may be made of nickel (Ni) with a thickness $T_1$ of 3 to 4 μm. The mound metal 30 may be made of copper (Cu) with a thickness $T_2$ of 1 to 4 μm. The mound metal 30 as shown in FIG. 2A has a doughnut shape with a width of 10 to 50 μm and surrounds the opening 19a in the fourth and top insulating films, 18 and 19. The semiconductor device 100 of the embodiment has the mound metal 30 with the width of 25 μm. The solder bump 21 may be an alloy containing tin (Sn) and silver (Ag), or sometimes further contain copper (Cu).

Next, a process of forming the semiconductor device 100 will be described referring to FIGS. 3A to 3E which are cross sections of the electrode 20 at respective steps.

Figure 3A:
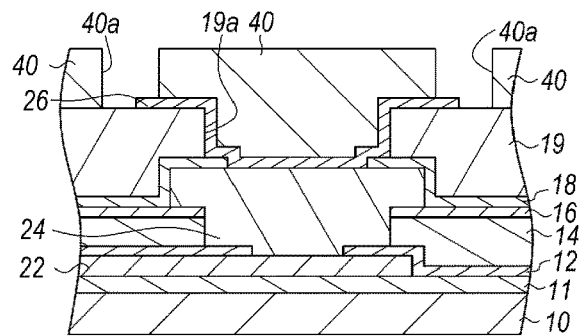
FIGS. 3A to 3E show respective steps of a process of forming the semiconductor device according to embodiment of the present invention.

First as shown in FIG. 3A, the process sequentially performs the steps of:
(a) epitaxially growing the semiconductor stack 11 on the substrate 10;
(b) inactivating a part of the semiconductor stack 11, for instance, an area where pads are to be formed, by implanting argon ions ($Ar^+$);
(c) depositing ohmic electrode 22 and allowing the electrode 22;
(d) depositing the first to third insulating films, 12, 14 and 16, on the semiconductor stack 11 and the ohmic electrode 22, where the first and third insulating films, 12 and 16, may be formed by the chemical vapor deposition (CVD) technique, while the second insulating film 14 is made of polyimide with a thickness of about 2 μm and formed by the spin coating accompanied with subsequent thermal curing;
(e) forming an opening in the first to third insulating films, 12 to 16, so as to expose the top of the ohmic electrode 22, then filling the opening in the first to third insulating films, 12 to 16, with the first interconnection 24 by plating a metal therein;
(f) depositing the fourth and top insulating films, 18 and 19, on the first interconnection 24 and the third insulating film 16 by the CVD technique, where the top insulating film 19 may be made of polyimide with a thickness of at least 2 μm;
(g) forming the opening 19a in the top and fourth insulating films, 18 and 19, by partially etching the insulating films, 18 and 19, where the opening 19a exposes the top of the first interconnections 24;
(h) forming the seed layer 26 so as to cover the top of the first interconnection 24, the side of the top insulating film each exposed within the opening 19a, and the top insulating film 19 in a part surrounding the opening 19a; and
(i) patterning a photoresist 40 so as to cover a center area of the seed layer 26 and the top of the top insulating film 19, where the photoresist 40 has a ringed or doughnut groove 40a within which an edge portion of the seed layer 40 and a portion of the top of the top insulating layer in an outer side of the edge portion of the seed layer 40 exposes.

Figure 3B:
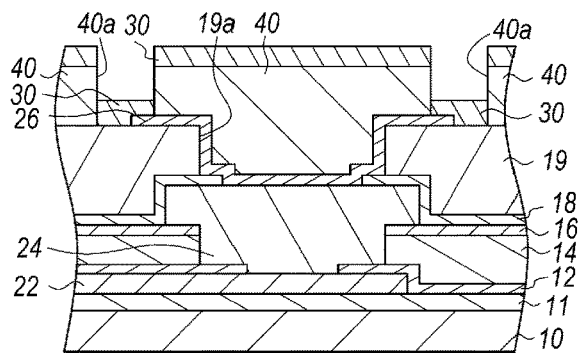
Figure 3C:
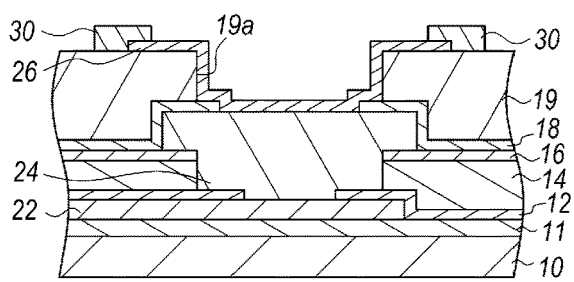
Figure 3D:
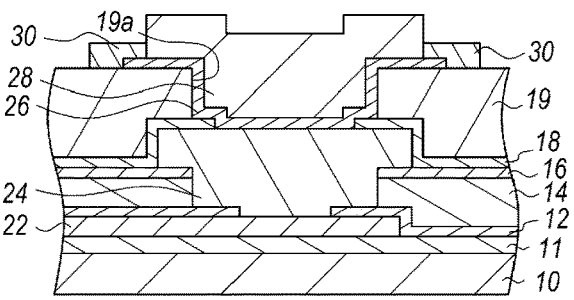
Figure 3E:
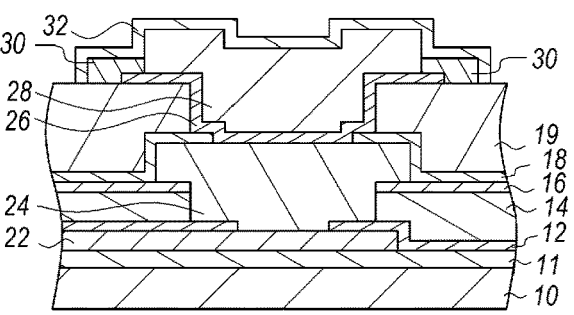

Second, as shown in FIG. 3B, the process deposits the mound metal 30, which may be made of copper (Cu) within the groove 40a and the top of the patterned photoresist 40. The mound metal 30 may cover the portion of the seed layer 26, namely, the top, the edge, and the side of the seed layer 26 within the groove 40a. Then, the lift-off technique may remove a portion of the seed metal 30 deposited on the top of the photoresist 40 so as to leave the mound metal 30 covering the edge portion of the seed layer 30 and the portion of the top of the top insulating film outside of the seed layer 30, FIG. 3C.

The second interconnection 28 extends from the surface of the seed layer 26 within the opening 19a vertically and laterally; however, the lateral extension of the second interconnection 28 may be prevented by the mound metal 30. That is, the mound metal 30 may operate as a barrier to interrupt the second interconnection 28 extending laterally on the top insulating film 19. Accordingly, the electroless plating may form the second interconnection 28 to fill the opening 19a and extends laterally to the inner edge of the mound metal 30 but may not ride on the mound metal 30 and extend beyond the mound metal 30. The electroless plating completes when the second interconnection 28 is in contact to the side of the mound metal 30.

The electroless plating, which carries out the plating metal without using a battery or any other electrical power supply, has been known to have various types; for instance, the displacement electroless plating that is based on the ionization tendency, auto-catalytic electroless plating using reducing agent, and a combination thereof, which is called as the displacement reduction type plating. The present embodiment adopts the auto-catalytic electroless plating but may use any other types of the electroless plating. On the other hand, an electro-plating, providing an electrical potential between the cathode and the plate, supplies electron within a solution containing material to be plated from the cathode and adsorbs the material onto a medium operated as the plate. Also, as a mask that prevents the lateral growth of the plated metal 28, a photoresist, an insulating film such as silicon nitride (SiN) may be utilized except for a metal of the embodiment. However, a photoresist sometimes leaves organic residues on the plated second interconnection 28, while, an SiN film is likely to cause an invasion of moisture in the interface against the top insulating film, which degrades the reliability of the semiconductor device 100. Accordingly, the mound metal made of metal is optimum, and selected from metals that effectively prevents the lateral expansion of the plated metal.

A cover metal 32 lastly covers the second interconnection 28 thus plated, the mound metal 30, and the top insulating film 19 in an area surrounding the mound metal 30. Applying a solder paste on the surface of the cover metal 32 and performing the reflow soldering, the process may forms the solder bump 21 on the cover metal 32. Thus, the process of forming the electrode 20 is completed.

Figure 4A:
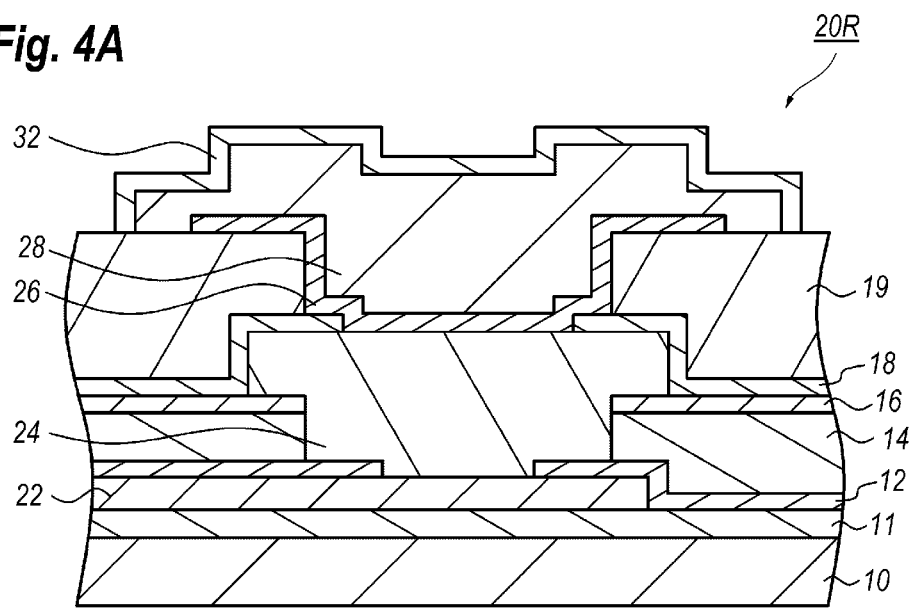
FIGS. 4A and 4B show cross sections of a semiconductor device comparable to the present invention.
Figure 4B:
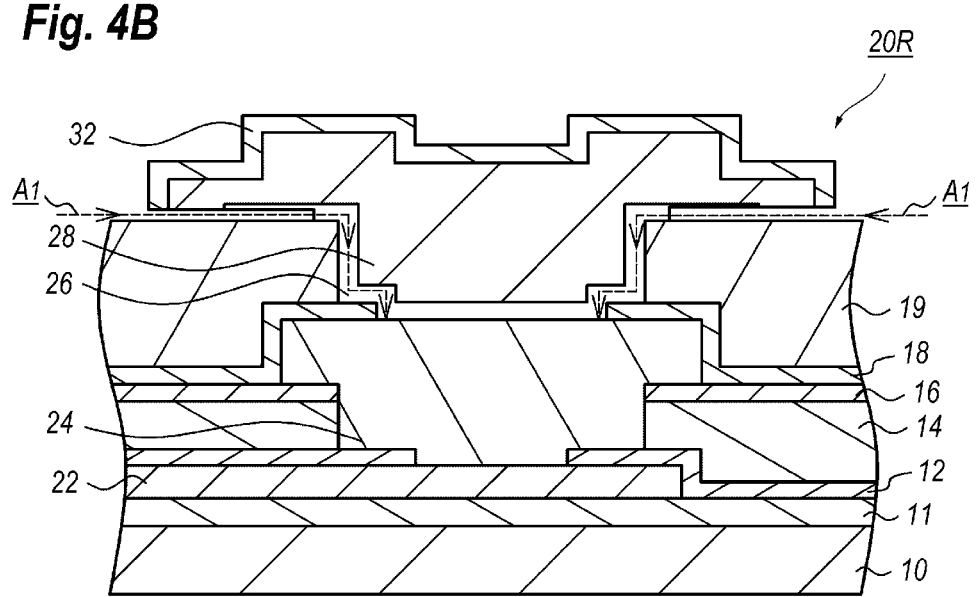

An arrangement of an electrode comparable to the present invention will be described as referring to FIGS. 4A and 4B, where FIG. 4A shows a cross section of an electrode 20R comparable to the present invention and FIG. 4B also shows a cross section of the electrode that explains a path through which water and/or solder invades within the semiconductor device 100. FIGS. 4A and 4B omit the solder bump 21.

As shown in FIG. 4A, the electrode 20R comparable to the invention removes the mound metal 30. Accordingly, the second interconnection 28 may extend beyond the edge of the seed layer 26 and reaches on the top of the top insulating film 19 and comes in contact thereto during the electroless plating. The seed layer 26 may show a function of the under bump metal (UBM) to prevent the solder from diffusing into the first interconnection 24.

The second interconnection 28 shows relatively poor adhesion against the top insulating film 19, which likely causes a gap therebetween as shown in FIG. 4B due to thermal stress during reflow soldering and/or mechanical shock by handling. Such a mechanical stress also likely causes in the second interconnection 28 to be peeled off from the top insulating film 19 and makes a gap therebetween. The gap between the second interconnection 28 and the top insulating film 19 may cause a pass $A_1$ through which water and solder invade within the first interconnection 24. Invading water may enhance the corrosion in the electrodes 22 and/or the electro-migration in the interconnection 24 and the electrodes 22. Invading solder may also cause a short circuit.

On the other hand, the electrode 20 of the embodiment, the mound metal 30 surrounds the edge of the seed layer 26, exactly, partly covers the outer edge portion of the seed layer 26, which may prevent the second interconnection 28 from spreading beyond the edge of the seed layer 28 and coming in contact with the top insulating film 19 during the electroless plating of the second interconnection 28 by the seed layer 26 as the seed metal. The plated second interconnection 28 laterally extends to the edge of the mound metal 30, which is provided on the seed layer 26, and is hard to extend further on the mound metal 30. Accordingly, the second interconnection 28 is apart from the top insulating film 19 and may enhance the tolerance against peeling off from the top insulating film 19. Also, the mound metal 30 may suppress the diffusion of the solder into the first interconnection 24. That is, the second interconnection 28 may be operable as a diffusion barrier for the solder into the first interconnection 24 and the electrodes.

Because the second interconnection 28 shows lesser adhesion against the top insulating film 19, the second interconnection 28 is likely to be peeled off or easily forms a gap against the top insulating film 19 when the second interconnection 28 laterally extends during the plating and comes in contact with the top insulating film 19. Accordingly, the second interconnection 28 is preferably apart from the top insulating film 19, or preferable not to come in contact with the top insulating film 19. Thus, the electroless plating is preferably to be completed when the plated second interconnection 28 comes in contact with the side of the mound metal 30 and not to ride on the mound metal 30.

The mound metal 30 has the adhesion against the top insulating film 19 that is higher than the adhesion of the second interconnection 28 against the top insulating film 19, which means that a gap is hard to be formed between the mound metal 30 and the top insulating film 19, and shows relatively higher tolerance against the invasion of the water and the solder.

The mound metal 30 is preferable to partially cover the edge portion of the seed layer 30 as being in contact with the edge the seed layer 26, that is, no gap is preferably formed between the edge of the seed layer 36 and the mound metal 30. Because the seed layer 26 in the edge portions thereof is covered with the mound metal 30, the seed layer 26 is hard to be peeled off, and suppresses the water and the solder from invading within the first interconnection 24.

The polyimide, which forms the top insulating film 19, generally shows lesser adhesion against nickel (Ni) in the second interconnection 28. On the other hand, copper (Cu), which is a material for the mound metal 30, shows relatively superior adhesion against the polyimide. Accordingly, the mound metal 30 made of copper (Cu) may effectively suppress the electrode 20 from being peeled off. The top insulating film 19 may be made of, except for polyimide, any other insulating material such as silicon nitride (SiN) and so on. Also, the second interconnection 28 may contain, except for nickel (Ni), palladium (Pd), aluminum (Al), and so on. Although the description above concentrates on the mound metal 30 made of copper (Cu), any other material showing the adhesion against the top insulating film 19 superior than that of the second interconnection 28 and the effective barrier against the lateral expansion of the second interconnection 28 during electroless plating. Specifically, titanium (Ti), aluminum (Al), magnesium (Mg), chromium (Cr), and so on may be applicable as the mound metal 30.

The mound metal preferably has a thickness of 1 to 4 μm in order to make the adhesion against the top insulating film 19 consistent with the effective barrier against the lateral expansion of the second interconnection 28. The mound metal 30 forms the step in the outer side thereof against the top insulating film 19. The cover metal 32 may effectively over the step and the solder bump 21 also covers the step, which means that the solder bump 21 may be in contact with the cover metal 32 in wider area and strengthen the adhesion against the cover metal 32. The mound metal 30 preferably has a width of 10 to 50 μm to enhance the adhesion against the top insulating film 19.

The electroless plating generally brings a stiff material, which also brings the function of the barrier against the solder diffusing into the first interconnection 24. The second interconnection preferably has a thickness of 3 to 4 μm, or about twice of that of the mound metal 30. Because the seed layer 26 is in contact with the side of the opening 19a of the top insulating film 19 and the second interconnection 28 fills the opening 19a; the second interconnection 28 may enhance the adhesion against the seed layer 26.

The cover layer 32 is not always necessary in the electrode 20. However, the cover layer 32 may enhance the wettability against the solder bump 21. Accordingly, the cover metal 32 may be made of material that enhances the wettability against the solder.

Figure 5:
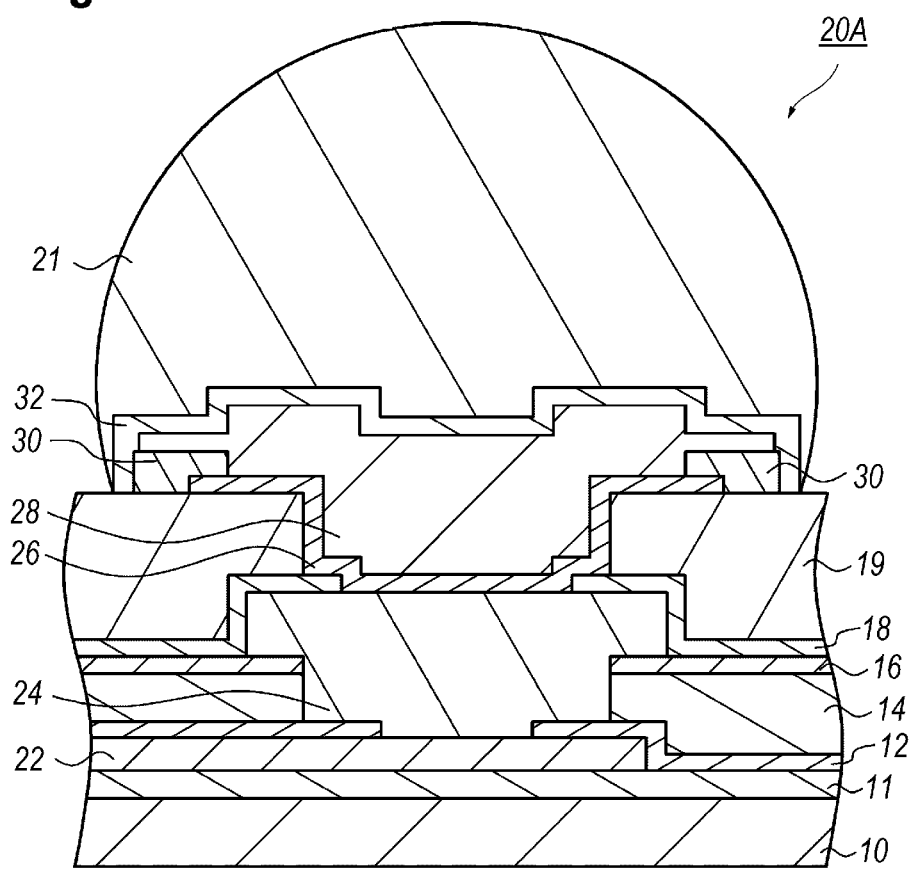
FIG. 5 shows a cross section of an electrode modified from the electrode shown in FIG. 2B.

FIG. 5 shows a cross section of an electrode 20A modified from the aforementioned electrode 20. The second interconnection 28 in the modified embodiment shown in FIG. 5 extends beyond the inner edge of the mound metal 30. That is, the second interconnection 28 rides on the top of the mound metal 30 because of an excess process of the electroless plating for the second interconnection 28. However, the second interconnection 28 is apart from the top insulating film 19, or the second interconnection 28 is not in contact with the top insulating film 19. Accordingly, the electrode 20A may also enhance the adhesion of the second interconnection 28 against the top insulating film 19.

Second Embodiment

Figure 6:
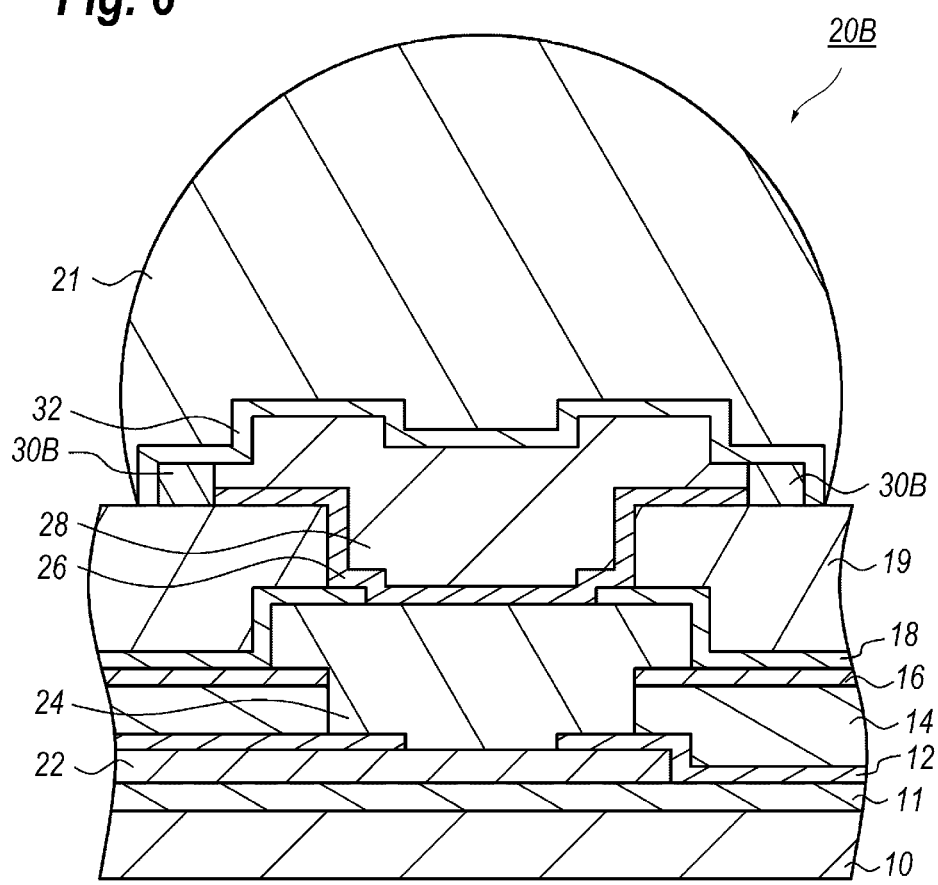
FIG. 6 shows a cross section of an electrode according to the second embodiment of the present invention.

FIG. 6 shows a cross section of an electrode 20B according to the second embodiment of the present application. As shown in FIG. 6, the mound metal 30B of the second embodiment does not partially cover the seed layer 26. That is, the inner edge of the mound metal 30B is in contact with the outer edge of the seed layer 26 but but does not form any gap therebetween. Even when the mound metal 30B has such an arrangement, the mound metal 30B may effectively show a function of a spreading barrier for the second interconnection 28 during the electroless plating. Thus, the second interconnection 28 is not in contact with the top insulating film 19, and the electrode 20B may effectively prevent water, or solder, from invading within the first interconnection 24 and the electrodes.

The first and second embodiment thus described concentrate on the arrangement of the BGA. However, the present invention concerning to the mound metal 30 may be not restricted to the electrode type of the BGA. Also, the electrode, 20 or 20B, of the embodiment include the ohmic electrode 22, the first interconnection 24, and the second interconnection 28 as the UBM, but the electrode, 20 or 20B, may have an arrangement different from those of the embodiment. The present invention may include at least the seed layer 26 as a seed metal for the electroless plating of the second interconnection 28. The mound metal 30 provided along the outer edge of the seed layer 26 may effectively prevent the plated material from extending beyond the outer edge of the seed layer 26.

The embodiment provides the electrodes 22 as a partial arrangement of an FET, but the electrode 20 may be connected with elements except for FETs. Also, the electrode, 20 to 20B, is provided on the semiconductor stack 11; but the electrode, 20 to 20B, may be provided on an area where no semiconductor stack 11, or no active elements, is formed.

The substrate 10 may be made of silicon carbide (SiC), silicon (Si), sapphire ($Al_2O_3$), gallium nitride (GaN), and so on that have an electrically insulating characteristic. The semiconductor stack 11 may include nitride or arsenide semiconductor materials, where nitride semiconductor materials include gallium nitride (GaN), aluminum gallium nitride (AlGaN), indium gallium nitride (InGaN), indium nitride (InN), aluminum indium gallium nitride (AlInGaN); while, arsenide semiconductor materials may include gallium arsenide (GaAs), aluminum gallium arsenide (AlGaAs), those including arsenic (As).

In the foregoing detailed description, the method and apparatus of the present invention have been described with reference to specific exemplary embodiment thereof. It will, however, be evident that various modifications and changes may be made thereto without departing from the broader spirit and scope of the present invention. The present specification and figures are accordingly to be regarded as illustrative rather than restrictive.

I claim:

1. A semiconductor device of ball grid array (BGA) type, the semiconductor device including an electrode, wherein the electrode comprises:
   an insulating film;
   a seed layer provided on the insulating film;
   a mound metal provided on the insulating film and surrounding the seed layer, the mound metal forming no gap with the seed layer; and
   an interconnection provided on the seed layer and riding on the mound metal,
   wherein the interconnection is apart from the insulating film, the seed layer and the mound metal interposing between the interconnection and the insulating film.

2. The semiconductor device of claim 1,
   further including a solder bump provided on the interconnection.

3. The semiconductor device of claim 2,
   further including a cover metal that covers the interconnection and the mound metal, the solder bump being provided on the cover metal.

4. The semiconductor device of claim 1,
   wherein the insulating film includes an opening that exposes an inside of the semiconductor device,
   wherein the seed layer covers the inside of the semiconductor device exposed within the opening, a side of the opening, and a portion of the insulating film in a portion immediate to the opening, and
   wherein the interconnection fills the opening.

5. The semiconductor device of claim 1,
   wherein the mound metal in an inner edge thereof is in direct contact with an outer edge of the seed layer without forming any gap through which the insulating film is exposed.

6. The semiconductor device of claim 5,
   wherein the inner edge of the mound metal overlaps with the seed layer.

7. The semiconductor device of claim 1,
   wherein the mound metal is made of one of copper (Cu), titanium (Ti), aluminum (Al), magnesium (Mg), and chromium (Cr).

8. The semiconductor device of claim 1,
   wherein the insulating film is made of polyimide.

9. The semiconductor device of claim 1,
   wherein the seed layer is made of one of palladium (Pd), copper (Cu), and zinc (Zn).

10. The semiconductor device of claim 1,
    wherein the interconnection is made of one of nickel (Ni), palladium (Pd), and aluminum (Al).

11. A semiconductor device of a ball grid array (BGA) type, the semiconductor device including an electrode, wherein the electrode comprises:

an insulating film;
a seed layer provided on the insulating film;
a mound metal provided on the insulating film and surrounding the seed layer, the mound metal forming no gap with the seed layer and fully covering an outer edge of the seed layer; and
an interconnection provided on the seed layer,
wherein the interconnection is apart from the insulating film, the seed layer and the mound metal interposing between the interconnection and the insulating film.

12. The semiconductor device of claim 11, further including a solder bump provided on the interconnection.

13. The semiconductor device of claim 11, further including a cover metal that covers the interconnection and the mound metal, the solder bump being provided on the cover metal.

14. The semiconductor device of claim 11, wherein the insulating film includes an opening that exposes an inside of the semiconductor device,
wherein the seed layer covers the inside of the semiconductor device exposed within the opening, a side of the opening, and a portion of the insulating film in a portion immediate to the opening, and
wherein the interconnection fills the opening.

15. The semiconductor device of claim 11, wherein the inner edge of the mound metal overlaps with the seed layer.

16. The semiconductor device of claim 11, wherein the interconnection rides on the mound metal.

17. The semiconductor device of claim 11, wherein the mound metal is made of one of copper (Cu), titanium (Ti), aluminum (Al), magnesium (Mg), and chromium (Cr).

18. The semiconductor device of claim 11, wherein the insulating film is made of polyimide.

19. The semiconductor device of claim 11, wherein the seed layer is made of one of palladium (Pd), copper (Cu), and zinc (Zn).

20. The semiconductor device of claim 11, wherein the interconnection is made of one of nickel (Ni), palladium (Pd), and aluminum (Al).

* * * * *